United States Patent
Kim

(10) Patent No.: US 9,508,415 B2
(45) Date of Patent: Nov. 29, 2016

(54) SEMICONDUCTOR MEMORY DEVICE FOR PERFORMING REFRESH OPERATION AND SEMICONDUCTOR MEMORY SYSTEM INCLUDING THE SAME

(71) Applicant: SK hynix Inc., Gyeonggi-do (KR)

(72) Inventor: Jung-Hyun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/619,876

(22) Filed: Feb. 11, 2015

(65) Prior Publication Data

US 2016/0086651 A1    Mar. 24, 2016

(30) Foreign Application Priority Data

Sep. 24, 2014   (KR) .......................... 10-2014-0127836

(51) Int. Cl.
| | | |
|---|---|---|
| *G11C 11/40* | (2006.01) | |
| *G11C 11/406* | (2006.01) | |
| *G11C 11/408* | (2006.01) | |
| *G11C 13/00* | (2006.01) | |

(52) U.S. Cl.
CPC .......... *G11C 11/406* (2013.01); *G11C 11/4085* (2013.01); *G11C 11/40611* (2013.01); *G11C 11/40622* (2013.01); *G11C 13/0033* (2013.01); *G11C 2211/401* (2013.01); *G11C 2211/406* (2013.01)

(58) Field of Classification Search
CPC .......... G11C 11/406; G11C 11/40622; G11C 13/0033; G11C 2211/401; G11C 2211/406
See application file for complete search history.

(56) References Cited

U.S. PATENT DOCUMENTS

| | | | |
|---|---|---|---|
| 9,299,400 B2 * | 3/2016 | Bains .................... | G11C 11/406 |
| 2014/0355332 A1 * | 12/2014 | Youn ................. | G11C 11/40615 365/149 |
| 2015/0058549 A1 * | 2/2015 | Jeffrey .................... | G11C 7/02 711/106 |

FOREIGN PATENT DOCUMENTS

| | | |
|---|---|---|
| KR | 1020010004653 | 1/2001 |
| KR | 1020160035897 | 4/2016 |

* cited by examiner

*Primary Examiner* — Vanthu Nguyen
(74) *Attorney, Agent, or Firm* — I P & T GROUP LLP

(57) ABSTRACT

A semiconductor memory device includes: a memory cell array including a plurality of word lines; a word line driving unit suitable for activating a first word line among the plurality of word lines corresponding to an input address signal; an activation time detection unit suitable for enabling a detection signal by detecting an activation time of the first word line; an address latch unit suitable for latching an address information for a second word line corresponding to the first word line in response to the detection signal; and an address output unit suitable for providing the word line driving unit with the latched address information for the second word line during a refresh operation.

3 Claims, 6 Drawing Sheets

SEMICONDUCTOR MEMORY DEVICE FOR PERFORMING REFRESH OPERATION AND SEMICONDUCTOR MEMORY SYSTEM INCLUDING THE SAME

CROSS-REFERENCE TO RELATED APPLICATIONS

The present application claims priority of Korean Patent Application No. 10-2014-0127836, filed on Sep. 24, 2014, which is incorporated herein by reference in its entirety.

BACKGROUND

1. Field

Exemplary embodiments of the present invention relate to a semiconductor designing technology, and more particularly, to a semiconductor memory device that performs a refresh operation.

2. Description of the Related Art

Semiconductor memory devices such as Double Data Rate Synchronous Dynamic Random Access Memory (DDR SDRAM) devices generally include a plurality of memory banks for storing data. Each of the memory banks also includes tens of millions of memory cells. Each memory cell includes a cell capacitor and a cell transistor, and a semiconductor memory device stores data by charging or discharging the cell capacitors. Theoretically, the amount of charge stored in a cell capacitor is uniform at all times if there is no control. In reality, however, the amount of charge stored in cell capacitors changes due to voltage differences between the memory cells and peripheral circuits. In other words, charges may leak out of charged cell capacitors, or cell capacitors that are discharged may unintentionally become charged. A change in the amount of charge in a cell capacitor signifies that the data stored in the cell capacitor has changed. This means that the stored data may be lost. To prevent the data from being lost, semiconductor memory devices perform refresh operations. Since the refresh operation is a widely known technology, a detailed description of this will not be provided.

As technology advances, the integration degree of semiconductor memory devices increases. The increase in the integration degree of semiconductor memory devices affects the size of memory banks. A decrease in the size of memory banks translates to a decrease in the space between memory cells, which also means that the space between word lines, coupled with the neighboring memory cells, becomes narrower as well. In the past, there has been no problem, or only limited issues, with the gaps between the word lines. However, as the gaps between the word lines becomes narrower and narrower, new problems are arising. Among the newly emerging problems is a coupling effect occurring between word lines.

Word line activation has to be performed to access a given memory cell of a semiconductor memory device. However, as the gap between the word lines becomes narrower, word line activation causes a coupling effect on the neighboring word lines. When the coupling effect occurs in the neighboring word lines, the memory cells coupled with the neighboring word lines may have difficulty retaining the data stored therein and may lose the data.

To overcome the coupling effect problem, the refresh operation cycle is shortened. In other words, the refresh operation is performed at a cycle that is short enough to keep the data in spite of the coupling effect. However, the coupling effect occurs only in some of the word lines, and performing the refresh operation at short intervals in all word lines is inefficient in terms of circuit operation and power consumption. After all, it is not efficient to make the refresh operation cycle of all word lines short since the coupling effect only occurs in a few word lines.

SUMMARY

An embodiment of the present invention is directed to a semiconductor memory device that may selectively control the word lines to be activated during a refresh operation.

In accordance with an embodiment of the present invention, a semiconductor memory device may include: a memory cell array including a plurality of word lines; a word line driving unit suitable for activating a first word line among the plurality of word lines corresponding to an input address signal; an activation time detection unit suitable for enabling a detection signal by detecting an activation time of the first word line; an address latch unit suitable for latching an address information for a second word line corresponding to the first word line in response to the detection signal; and an address output unit suitable for providing the word line driving unit with the latched address information for the second word line during a refresh operation.

The first and second word lines may be adjacent to each other.

The activation time detection unit may include: a reference value generator suitable for generating a reference value; and an activation time comparator suitable for enabling the detection signal by comparing the activation time of the first word line with the reference value.

The reference value may depend on an operation state of the memory cell array.

In accordance with an embodiment of the present invention, a semiconductor memory device may include: a memory cell array including a plurality of word lines; a word line driving unit suitable for activating a first word line among the plurality of word lines corresponding to an input address signal; an activation time detection unit suitable for enabling a first detection signal by detecting an activation time of the first word line; a detection number detection unit suitable for enabling a second detection signal by detecting enablement numbers of the first detection signal; an address latch unit suitable for latching an address information for a second word line corresponding to the first word line in response to the second detection signal; and an address output unit suitable for providing the word line driving unit with the latched address information for the second word line during a refresh operation.

The detection number detection unit may include: an enablement number counter suitable for counting the enablement numbers of the first detection signal; a reference number value generator suitable for generating a reference number value; and a reference number value comparator suitable for enabling the second detection signal by comparing the enablement numbers of the first detection signal with the reference number value.

In accordance with an embodiment of the present invention, a semiconductor memory device may include: a memory cell array including a plurality of word lines; a word line driving unit suitable for activating a first word line among the plurality of word lines corresponding to an input address signal; a reset control unit suitable for generating a reset signal in response to an active signal and an address signal for the first word line; an activation time detection unit responsive to the active signal and the reset signal, and suitable for enabling a detection signal by detecting an activation time of the first word line; an address latch unit suitable for latching an address information for a second word line corresponding to the first word line in response to the detection signal; and an address output unit suitable for providing the word line driving unit with the latched address information for the second word line during a refresh operation.

The activation time detection unit may include: a counter reset in response to the reset signal, and suitable for generating a count value by performing a counting operation in response to the active signal; a reference value generator suitable for generating a reference value; and a count value comparator suitable for enabling the detection signal by comparing the count value with the reference value.

The reset signal may be disabled when the address signal for the first word line is inputted consecutively with the active signal.

In accordance with another embodiment of the present invention, a semiconductor memory device includes: a memory cell array including a plurality of word lines; a word line driving unit suitable for activating first word lines among the plurality of word lines corresponding to input address signals; an activation time detection unit suitable for enabling a first detection signal by detecting an activation time of first word lines; a detection number detection unit suitable for enabling a second detection signal by detecting activation numbers of first word lines; an address latch unit suitable for latching an address information for a second word line corresponding to first word lines in response to each of the first and second detection signals; and an address output unit suitable for providing the word line driving unit with the latched address information for the second word line during a refresh operation.

The second word line may be adjacent to one or more of the first word lines.

The address output unit may provide the latched address information corresponding to the first and second detection signals in a predetermined order.

The predetermined order may be an order that the address latch unit latches the address information for the second word line in response to the first and second detection signals.

The activation time detection unit may compare the activation time of the first word line with a first reference value. The activation number detection unit may compare the activation numbers of the first word line with a second reference value.

One or more of the first second reference values may depend on an operation state of the memory cell array.

In accordance with yet another embodiment of the present invention, a semiconductor memory system includes: a controller suitable for generating refresh type information based on an active signal and an address signal; and a semiconductor memory device suitable for setting a target detection condition based on the refresh type information, detecting a first word line among a plurality of word lines based on the target detection condition, and performing a refresh operation on a second word line adjacent to the first word line.

The target detection condition may include an activation time and activation numbers of the first word line.

The semiconductor memory device may include: an activation time detection unit suitable for detecting the activation time of the first word line; and an activation number detection unit suitable for detecting the activation numbers of the first word line.

The semiconductor memory device may activate one or more of the activation time detection unit and the activation number detection unit based on the target detection condition.

The refresh type information is set based on one or more of the enablement numbers of the active signal and enablement numbers of the address signal.

DETAILED DESCRIPTION

Figure 1:
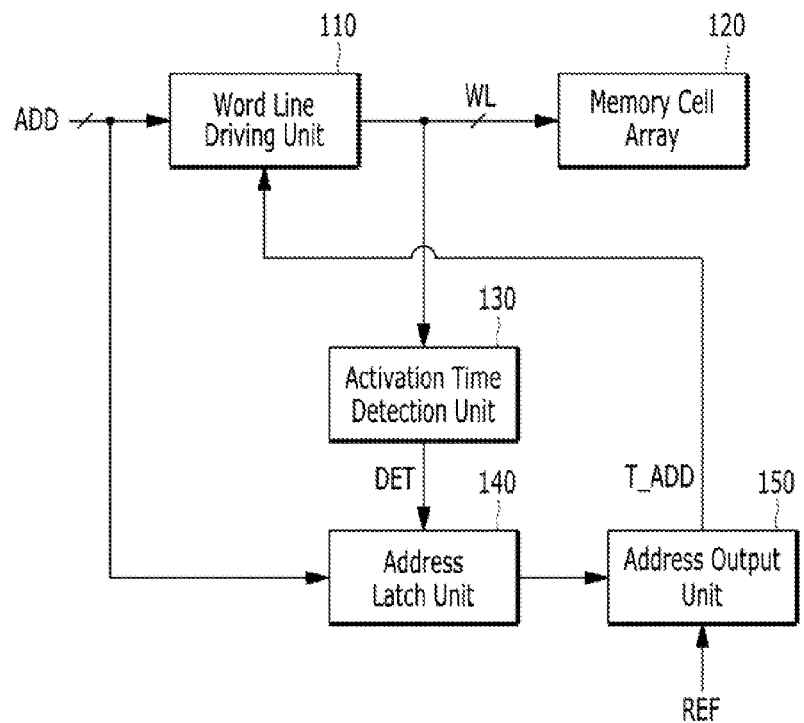
FIG. 1 is a block view illustrating a semiconductor memory device in accordance with a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block view illustrating a semiconductor memory device in accordance with a first embodiment of the present invention.

Referring to FIG. 1, the semiconductor memory device may include a word line driving unit 110, a memory cell array 120, an activation time detection unit 130, an address latch unit 140, and an address output unit 150.

The word line driving unit 110 may receive an external address signal ADD inputted during a read/write operation, and activate a target word line corresponding to the address signal ADD among a plurality of word lines WL. The word line driving unit 110 may receive a neighboring word line address signal T_ADD during a refresh operation, and activate a neighboring word line corresponding to the neighboring word line address signal T_ADD, which will be described later on.

The memory cell array 120 may store data and include a plurality of word lines WL. Each of the word lines WL may be coupled with a plurality of memory cells. Each of the memory cells coupled with the target word line may receive and store data through a write operation, or output the data stored therein through a read operation.

The activation of the word line may allow the corresponding memory cells to output and store, or refresh data through the activated word line, which means that the refresh operation may be performed to the activated word line.

The activation time detection unit 130 may detect an activation time of the target word line among the word lines WL. When the target word line is activated for more than a predetermined time, the activation time detection unit 130 enables a detection signal DET.

The address latch unit 140 may latch the address signal ADD inputted during a read/write operation in response to the detection signal DET. As described above, the enablement of the detection signal DET may represent that the target word line remains activated for more than the predetermined time. Therefore, the address signal ADD that is latched in the address latch unit 140 may include address information of the target word line. The address information of the target word line may include address information of the neighboring word line, which is adjacent to the target word line, and corresponds to the neighboring word line address signal T_ADD. The address latch unit 140 may output the address information of the neighboring word line to the address output unit 150.

The address output unit 150 may provide the word line driving unit 110 with the neighboring word line address signal T_ADD based on the address information of the neighboring word line received from the address latch unit 140 in response to a refresh signal REF that is enabled during the refresh operation. As a result, the word line driving unit 110 may activate the neighboring word lines, which are adjacent to the long activated target word line, in response to the neighboring word line address signal T_ADD during the refresh operation. Therefore, the refresh operation may be performed for the neighboring word lines.

The semiconductor memory device in accordance with the first embodiment of the present invention may detect the activation time of the target word line that is activated during a read/write operation, latch the neighboring word line address signal T_ADD of the neighboring word line adjacent to the target word line, and perform the refresh operation on the neighboring word lines when the target word line remains activated longer than the predetermined time.

As described above, as the gap between the word lines becomes very narrow, a coupling effect may occur frequently between the word lines. When the target word line stays in the activated state for more than the predetermined time, the coupling effect may occur in the neighboring word lines adjacent to the target word line. To solve this problem, the semiconductor memory device in accordance with the first embodiment of the present invention may detect the target word line that remains activated longer than a predetermined time, and perform the refresh operation on the neighboring word lines adjacent to the target word line. In this way, the data stored in the neighboring word lines may be protected from being lost.

Figure 2:
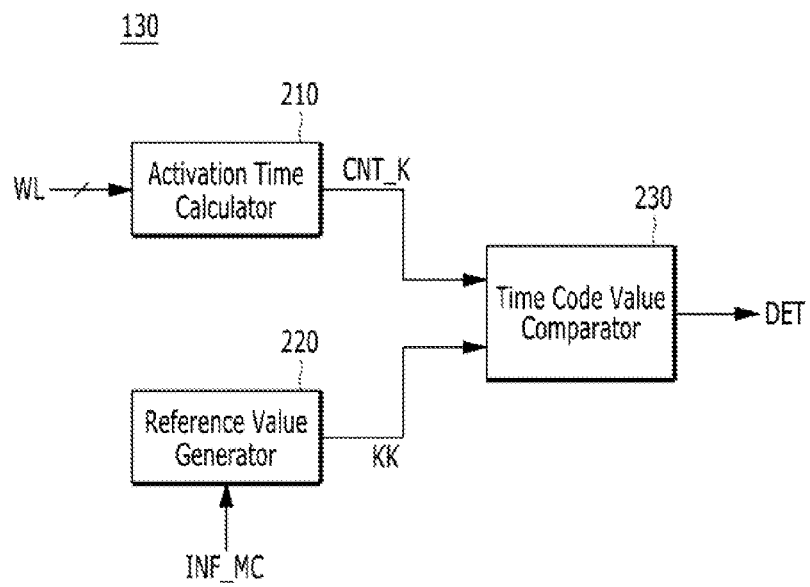
FIG. 2 is a block view illustrating an activation time detection unit shown in FIG. 1.

FIG. 2 is a block view illustrating the activation time detection unit 130 shown in FIG. 1. The activation time detection unit 130 may be embodied in various ways. FIG. 2 exemplarily shows the activation time detection unit 130 embodied with a countable code value.

Referring to FIG. 2, the activation time detection unit 130 may include an activation time calculator 210, a reference value generator 220, and a time code value comparator 230.

The activation time calculator 210 may calculate an activation time of the target word line among the word lines WL, and output a time code value CNT_K. The activation time calculator 210 may be formed of a counter that may generate the time code value CNT_K by counting the activation time of the target word line.

The reference value generator 220 may generate a reference value KK to be compared with the time code value CNT_K. The reference value KK may depend on the operation state of the memory cell array 120, which will be described again later on.

The time code value comparator 230 may compare the time code value CNT_K with the reference value KK and may generate the detection signal DET. Whether to enable the detection signal DET is decided based on the comparison between the time code value CNT_K and the reference value KK.

The reference value generator 220 may control the reference value KK based on memory cell operation state information INF_MC. The memory cell operation state information INF_MC represents the operation state of the memory cell array 120 shown in FIG. 1. A deteriorated memory cell, the operation condition of which is not fine (e.g., does not hold charges precisely or does not operate precisely), may have bad refresh operation characteristics and thus may have a high probability of losing the data stored therein. In this case, the refresh operation for the deteriorated memory cell may be controlled according to the refresh operation characteristics of the deteriorated memory cell by controlling the reference value KK. This is described in detail below with reference to FIG. 3.

Figure 3:
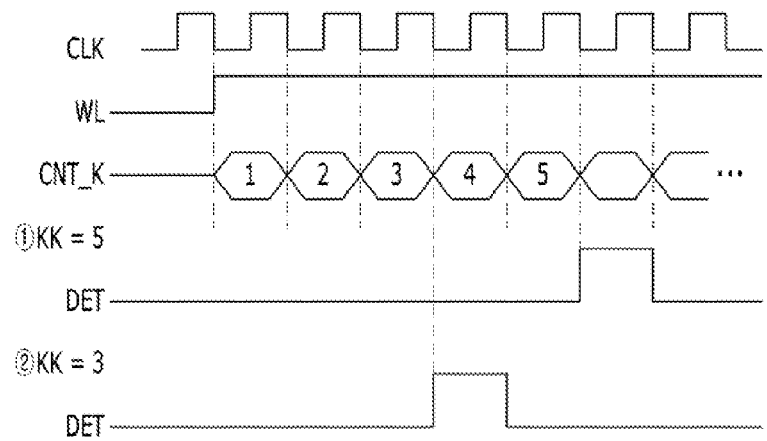
FIG. 3 is a timing view illustrating an operation of a semiconductor memory device shown in FIGS. 1 and 2.

FIG. 3 is a timing view illustrating an operation of the semiconductor memory device shown in FIGS. 1 and 2.

FIG. 3 shows a counting clock signal CLK, the target word line WL, the time code value CNT_K, the reference value KK, and the detection signal DET. Herein, it is assumed that the counting clock signal CLK is a clock signal CLK inputted into a counter circuit when the activation time calculator 210 is the counter circuit using the clock signal CLK.

Hereafter, for the sake of convenience in description, a case $\hat{1}$ where a memory cell is normal and a case $\hat{2}$ where a memory cell is deteriorated are described. When the memory cell is normal, it is assumed that the reference value KK is set to '5', and when the memory cell is deteriorated, it is assumed that the reference value KK is set to '3'.

As to the case $\hat{1}$, when the target word line WL is activated during the read/write operation, the time code value CNT_K may be counted. Since the reference value KK is set to '5', when the time code value CNT_K is counted up to '5', the detection signal DET may be enabled to a logic high level. The address latch unit 140 may latch the neighboring word line address information corresponding to the target word line WL in response to the detection signal DET. Subsequently, the address output unit 150 may provide the word line driving unit 110 with the neighboring word line address signal T_ADD corresponding to the neighboring word line address information that is latched in the address latch unit 140 during the refresh operation. After all, when the target word line remains activated more than '5' during the read/write operation, the neighboring word lines adjacent to the long activated target word line are activated and perform the refresh operation.

As to the case 2̂, when the target word line WL is activated during the read/write operation, the time code value CNT_K may be counted. Since the reference value KK is set to '3', when the time code value CNT_K is counted up to '3', the detection signal DET may be enabled to a logic high level, and the subsequent operation is the same as that of the case 1̂.

As shown in the drawing, the detection signal DET may be enabled to a logic high level when the target word line WL remains activated more than the predetermined time, for example, the '5' in the case 1̂ and the '3' in the case 2̂. The enablement of the detection signal DET may lead the neighboring word lines to the refresh operations when the refresh signal REF is enabled. As such, the refresh operations between the deteriorated memory cell and the normal memory cell may be controlled by controlling the reference value KK, for example, the '5' in the case 1̂, and the '3' in the case 2̂.

The semiconductor memory device in accordance with the first embodiment of the present invention may control the reference value KK according to the operation state of a memory cell, and decide whether to perform a refresh operation based on the controlled reference value KK.

As another example, the activation time detection unit 130 may have a structure of directly comparing the pulse widths of an actual signal that is applied to the target word line with the reference value KK, which is a signal having a predetermined pulse width. In the semiconductor memory device in accordance with the first embodiment of the present invention, the pulse width of the reference value KK may be controlled based on the operation state of a memory cell.

Figure 4:
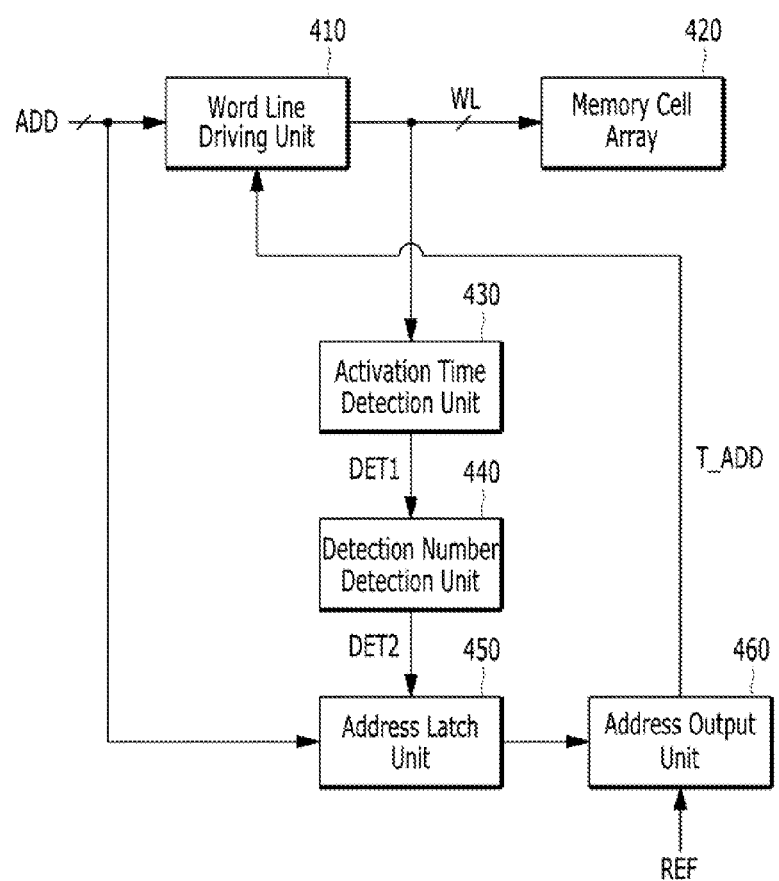
FIG. 4 is a block view Illustrating a semiconductor memory device in accordance with a second embodiment of the present invention.

FIG. 4 is a block view illustrating a semiconductor memory device in accordance with a second embodiment of the present invention.

The activation of a word line is closely related to an active operation because the word line is activated according to an address signal that is inputted together with an active signal, which means that activation numbers of the target word line may matter as well as the single activation time of the target word line. When the target word line is shortly activated each time but activated multiple times in response to plural active signals, the coupling effect on the neighboring word lines from the shortly activated target word line may still be a concern despite of the refresh operation of the neighboring word lines according to the long activated target word line in response to a single active signal. FIG. 4 shows a solution to this concern.

Referring to FIG. 4, the semiconductor memory device may include a word line driving unit 410, a memory cell array 420, an activation time detection unit 430, a detection number detection unit 440, an address latch unit 450, and an address output unit 460.

The semiconductor memory device shown in FIG. 4 may be the same as the semiconductor memory device described with reference to FIG. 1 except for the detection number detection unit 440. Hereafter, the detection number detection unit 440 is described. The detection signal DET described with reference to FIG. 1 is referred to as 'a first detection signal DET1', herein.

The detection number detection unit 440 may detect the number of times that the first detection signal DET1 is enabled, generate a second detection signal DET2, and provide the address latch unit 450 with the generated second detection signal DET2. The structure and operation of the detection number detection unit 440 are described more in detail with reference to FIGS. 5 and 6.

Figure 5:
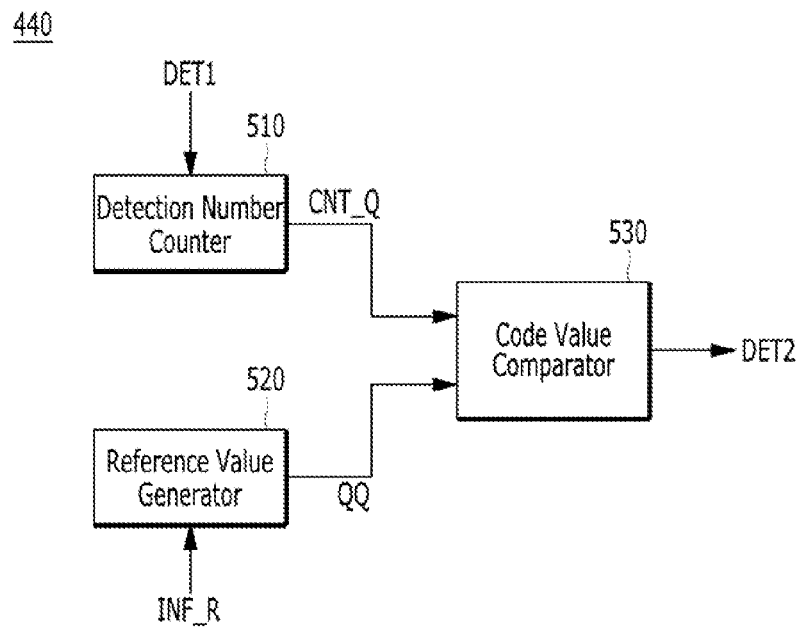
FIG. 5 is a block view illustrating a detection number counting unit shown in FIG. 4.

FIG. 5 is a block view illustrating the detection number counting unit 440 shown in FIG. 4.

Referring to FIG. 5, the detection number detection unit 440 may include a detection number counter 510, a reference value generator 520, and a code value comparator 530.

The detection number counter 510 may count the number of times that the first detection signal DET1 is enabled. When the first detection signal DET1 is enabled, the detection number counter 510 may update an enablement number code value CNT_Q, which is the number of enablements of the first detection signal DET1, and may output the updated enablement number code value CNT_Q.

The reference value generator 520 may generate a reference number value QQ in response to a reference value INF_R that is set in the activation time detection unit 430 described with reference to FIG. 4. The reference value INF_R set may be the reference value KK described with reference to FIG. 2. As mentioned earlier, the reference value KK may be set based on the operation state of a memory cell. Therefore, the reference number value QQ may also be set based on the operation state of a memory cell. The reference number value QQ will also be described again later with reference to FIG. 6.

The code value comparator 530 may compare the enablement number code value CNT_Q with the reference number value QQ, and generate the second detection signal DET2 based on the comparison result. Whether to enable the second detection signal DET2 is decided based on the comparison between the enablement number code value CNT_Q and the reference number value QQ.

Figure 6:
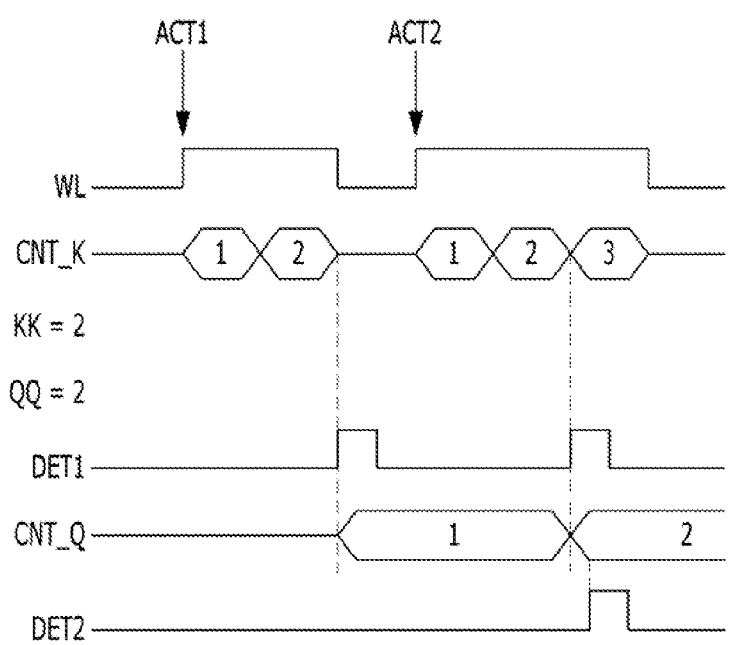
FIG. 6 is a timing view illustrating an operation of a semiconductor memory device shown in FIGS. 4 and 5.

FIG. 6 is a timing view illustrating an operation of the semiconductor memory device shown in FIGS. 4 and 5.

Referring back to the first embodiment with the assumption that the reference value KK described with reference to FIG. 2 is '4', the refresh operation of the first embodiment may be performed on the neighboring word lines when the target word line remains activated longer than '4' of the reference value KK. However, in the case that the target word line is consecutively activated twice or more before enablement of the refresh signal REF and the activation time of each activation is shorter than '4' of the reference value KK, namely '2', the refresh operation is not performed to the neighboring word lines even though the total activation time of the activations ('2' for each activation and thus totally '4' or greater) is substantially the same as or greater than '4' of the reference value KK.

In accordance with the second embodiment of the present invention described with reference to FIGS. 4 and 5, the refresh operation may be performed to the neighboring word lines when the target word line is shortly activated each time but consecutively activated multiple times in response to plural active signals before enablement of the refresh signal REF.

Referring to FIG. 6, it is assumed that the reference value KK is set to '2' and the reference number value QQ is set to '2'. When the first active signal ACT1 is inputted, the corresponding target word line WL may be activated, and the time code value CNT_K may be counted up to '2'. As a result, the first detection signal DET1 may be enabled to a logic high level. Herein, the detection number counter 510 shown in FIG. 5 may count the first detection signal DET1 and output '1' as the enablement number code value CNT_Q.

Subsequently, when the second active signal ACT2 is inputted for the same target word line WL, the target word line WL may be activated again and the time code value CNT_K may be counted up to '3'. Therefore, the first detection signal DET1 may be enabled to a logic high level, and the enablement number code value CNT_Q may become '2'. Herein, since the reference number value QQ of the reference value generator 520 is set to '2', the second detection signal DET2 may be enabled to a logic high level. The generated second detection signal DET2 is transmitted to the address latch unit 450 and the address latch unit 450 may latch the neighboring word line address information. After all, the refresh operation may be performed to the neighboring word lines when the target word line is shortly activated each time but consecutively activated multiple times in response to plural active signals before enablement of the refresh signal REF.

Compared with the first embodiment with '4' of the reference value KK, the total activation time of the activations of the second embodiment ('2' of the first activation in response to the first active signal ACT1 and '3' of the second activation in response to the second active signal ACT2, and thus totally '5') may be substantially greater than '4' of the reference value KK of the first embodiment. Therefore, in accordance with the second embodiment of the present invention, the refresh operation may be performed to the neighboring word lines when the target word line is shortly activated each time but consecutively activated multiple times in response to plural active signals, thereby remaining activated for a substantially long time before enablement of the refresh signal REF.

Figure 7:
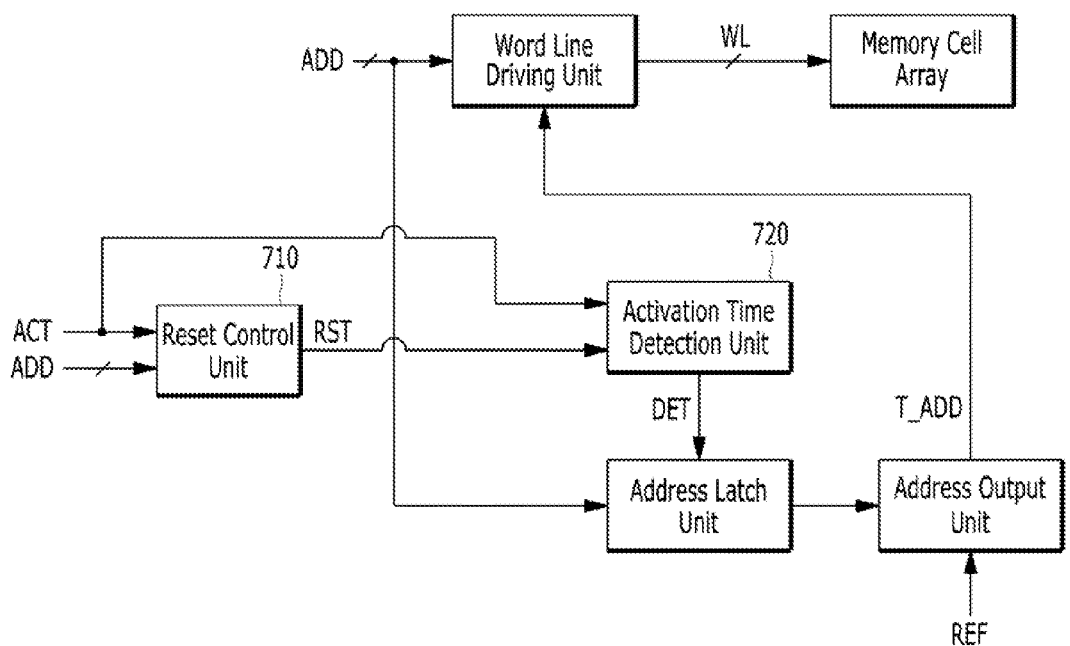
FIG. 7 is a block view illustrating a semiconductor memory device in accordance with a third embodiment of the present invention.

FIG. 7 is a block view illustrating a semiconductor memory device in accordance with a third embodiment of the present invention.

The semiconductor memory device shown in FIG. 7 may be the same as the semiconductor memory device described with reference to FIGS. 1 to 3 except for a reset control unit 710 and an activation time detection unit 720. Hereafter, the reset control unit 710 and the activation time detection unit 720 are described.

Referring to FIG. 7, the reset control unit 710 may generate a reset signal RST for initializing a counting operation of the activation time detection unit 720 in response to an address signal ADD and an active signal ACT. This will be described later in detail with reference to FIG. 8.

The activation time detection unit 720 may detect the activation time of the target word line that is activated through a counting operation. The activation time detection unit 720 may perform the counting operation in response to the active signal ACT, and perform an initialization operation in response to the reset signal RST. This will be described later in detail with reference to FIG. 9.

Figure 8:
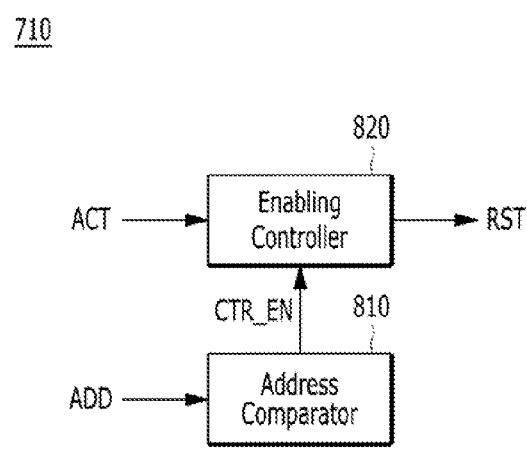
FIG. 8 is a block view illustrating a reset control unit shown in FIG. 7.

FIG. 8 is a block view Illustrating the reset control unit 710 shown in FIG. 7.

Referring to FIG. 8, the reset control unit 710 may include an address comparator 810 and an enabling controller 820.

The address comparator 810 may compare address signals ADD that are consecutively applied. The address comparator 810 may generate an enabling control signal CTR_EN by comparing the consecutively applied address signals ADD with each other. The address comparator 810 may enable the enabling control signal CTR_EN when the same address signal ADD is consecutively applied.

The enabling controller 820 may generate the reset signal RST in response to the active signal ACT and the enabling control signal CTR_EN.

Hereafter, an operation of the reset control unit 710 is briefly described.

The address signal ADD may be inputted with the active signal ACT, and the reset signal RST may be enabled in response to the active signal ACT. The address comparator 810 may compare the consecutively inputted address signals ADD with each other. When the same address signal ADD is inputted consecutively, the address comparator 810 may enable the enabling control signal CTR_EN. Subsequently, the enabling controller 820 may disable the reset signal RST in response to the enabling control signal CTR_EN. In other words, the reset signal RST may be enabled in response to the active signal ACT while the reset signal RST may be disabled in response to the enabling control signal CTR_EN when the same address signal ADD is inputted consecutively.

Figure 9:
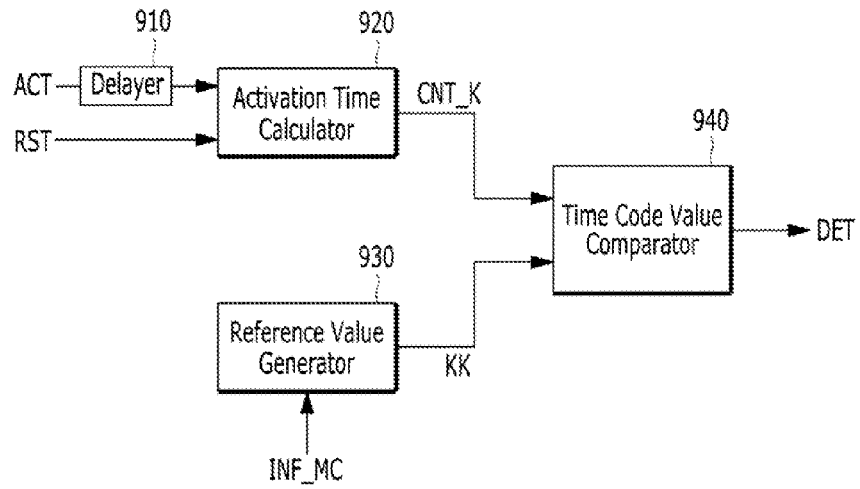
FIG. 9 is a block view illustrating an activation time detection unit shown in FIG. 7.

FIG. 9 is a block view illustrating the activation time detection unit 720 shown in FIG. 7.

Referring to FIG. 9, the activation time detection unit 720 may include a delayer 910, an activation time calculator 920, a reference value generator 930, and a time code value comparator 940.

The delayer 910 may delay the active signal ACT for a predetermined time. The delayer 910 may help the activation time calculator 920 in performing a stable counting operation, which is described below.

The activation time calculator 920 may perform the counting operation in response to the reset signal RST and an output signal of the delayer 910, and generate a time code value CNT_K through the counting operation. The time code value CNT_K may be initialized in response to the reset signal RST, and may be counted in response to the output signal of the delayer 910.

The reference value generator 930 may generate a reference value KK to be compared with the time code value CNT_K. The reference value KK may depend on the operation state of the memory cell array, which is the same as the reference value generator 220 described with reference to FIGS. 2 and 3.

The time code value comparator 940 may generate the detection signal DET by comparing the time code value CNT_K with the reference value KK. The detection signal DET may be enabled when the time code value CNT_K is greater than the reference value KK.

Hereafter, a circuit operation is described with reference to FIGS. 7 to 9.

When the active signal ACT is inputted, the address signal ADD corresponding to the active signal ACT may be inputted. The enabling controller 820 may enable the reset signal RST based on the active signal ACT, and the activation time calculator 920 may initialize the time code value CNT_K in response to the reset signal RST. The delayer 910 may delay the active signal ACT by a predetermined time and provide the activation time calculator 920 with the delayed active signal. Therefore, the activation time calculator 920 may perform an initialization operation based on the reset signal RST, and perform a counting operation based on the active signal ACT.

The semiconductor memory device in accordance with the third embodiment of the present invention may perform the following operation according to three cases.

A first case is when the time code value CNT_K is counted more than the reference value KK, which means that the target word line remains activated longer than the predetermined time represented by the reference value KK. Therefore, the detection signal DET may be enabled, and as a result, the address latch unit 140 may latch the neighboring word line address information. In this way, the neighboring word lines may be activated during the refresh operation when the target word line remains long activated (i.e. activated for a long time) in response to a single active signal ACT.

A second case is when the active signal ACT is inputted for another address signal ADD while the time code value CNT_K is counted less than the reference value KK, which means that the target word line remains activated shorter than the predetermined time represented by the reference value KK. In this case, the reset signal RST may be enabled based on the active signal ACT for another address signal ADD. The enabled reset signal RST may allow the time code value CNT_K to be initialized. This second case where the time code value CNT_K is counted less than the reference value KK means that the target word line remains activated for a duration that is not long enough to cause the coupling effect on the neighboring word lines. Therefore, the detection signal DET may not be enabled.

The third case is when the active signal ACT Is consecutively inputted for the same address signal ADD while the time code value CNT_K is not yet counted up to the reference value KK, which means that the target word line is shortly activated each time but activated multiple times in response to plural active signals. In this case, the address comparator 810 may detect the input of the same address signal ADD and enable the enabling control signal CTR_EN. Therefore, although the next active signal ACT is inputted, the reset signal RST may not be enabled. In other words, the reset signal RST may remain disabled. The time code value CNT_K may be counted continuously due to the disabled reset signal RST. After all, the refresh operation may be performed to the neighboring word lines when the target word line is shortly activated each time but consecutively activated multiple times in response to plural active signals before enablement of the refresh signal REF, which is similar to the second embodiment of the present invention described with reference to FIGS. 4 to 6.

The semiconductor memory device in accordance with the third embodiment of the present invention may detect the target word line, which remains long activated in response to a single active signal ACT, as well as the target word line, which is shortly, multiply, and consecutively activated in response to the multiple active signals ACT, and stably perform the refresh operation on the neighboring word lines.

The above described first and second embodiments of the present invention may perform the refresh operation on the neighboring word lines when the target word line remains long activated in response to a single active signal ACT or the target word line is shortly, multiply, and consecutively activated for longer than a predetermined time. Hereafter, a fourth embodiment will be described. According to the fourth embodiment, the semiconductor memory device may perform the refresh operation to the neighboring word lines with consideration of the activation numbers as well as the activation time of the target word line.

Figure 10:
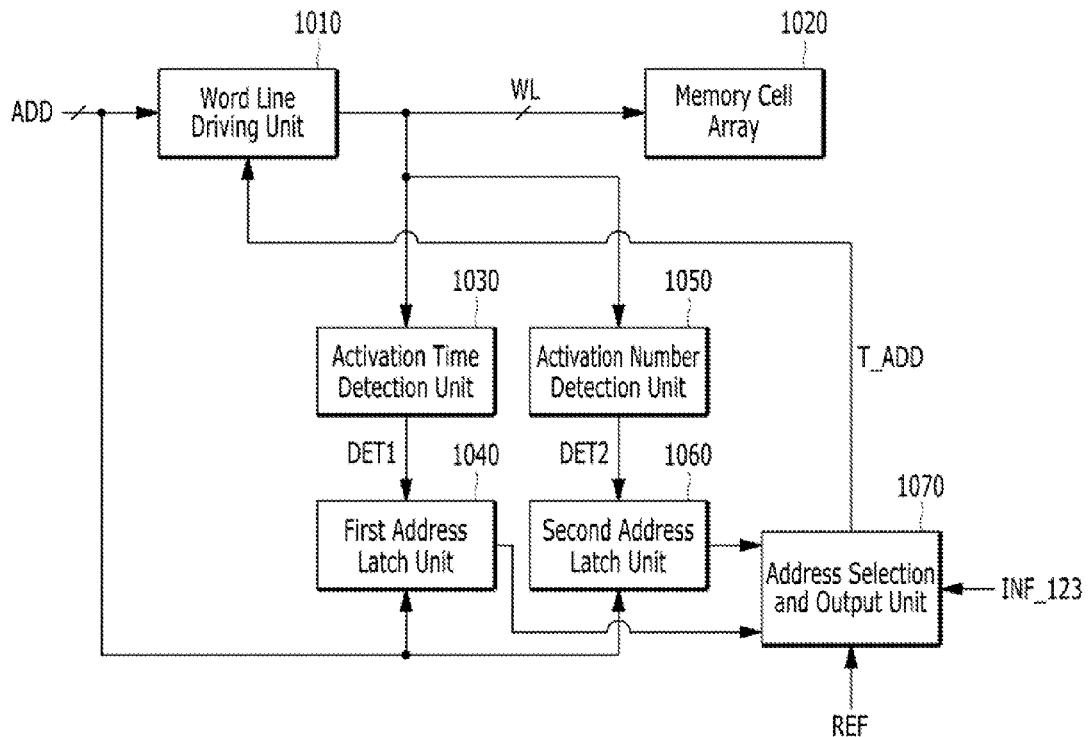
FIG. 10 is a block view illustrating a semiconductor memory device in accordance with a fourth embodiment of the present invention.

FIG. 10 is a block view illustrating a semiconductor memory device in accordance with a fourth embodiment of the present invention.

Referring to FIG. 10, the semiconductor memory device may include a word line driving unit 1010, a memory cell array 1020, an activation time detection unit 1030, a first address latch unit 1040, an activation number detection unit 1050, a second address latch unit 1060, and an address selection and output unit 1070.

The word line driving unit 1010 may be the same as the word line driving units 120 and 420 described with reference to FIGS. 1 to 9.

The activation time detection unit 1030 may be the same as the activation time detection units 130 and 430 as described with reference to FIGS. 1 to 6.

The first address latch unit 1040 may be the same as the address latch units 140 and 450 as described with reference to FIGS. 1 to 9.

The activation number detection unit 1050 may be the same as the activation number detection unit 440 as described with reference to FIGS. 4 to 6 except that the activation number detection unit 1050 may detect the activation numbers of the target word line based on word line driving signals provided from the word line driving unit 1010 to the memory cell array 1020.

The second address latch unit 1060 may be the same as the address latch units 140 and 450 as described with reference to FIGS. 1 to 9.

The address selection and output unit 1070 may sequentially output the neighboring word line address information provided by the first and second address latch units 1040 and 1060 based on output sequence information INF_123. To be specific, the address selection and output unit 1070 may output the neighboring word line address signals T_ADD provided from the first and second address latch unit 1040 and 1060 in the order designated by the output sequence information INF_123. Herein, the output sequence information INF_123 may be set based on diverse operation states. For example, the output sequence information INF_123 may allow the address selection and output unit 1070 to firstly output the neighboring word line address signal T_ADD included in the neighboring word line address information that is latched first between the first and second address latch units 1040 and 1060.

The semiconductor memory device in accordance with the fourth embodiment of the present invention may perform the refresh operation based on the activation time as well as the activation numbers of the target word line. Also, the semiconductor memory device may flexibly control the refresh operation by sequentially outputting the neighboring word line address signals T_ADD detected based on the activation time as well as the activation numbers of the target word line.

Figure 11:
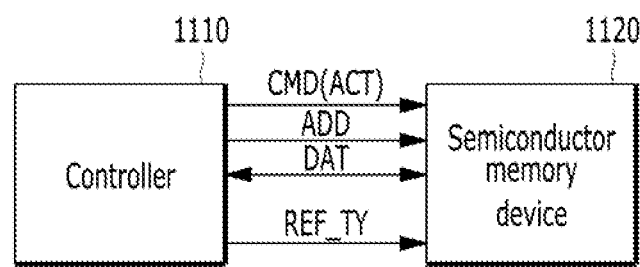
FIG. 11 is a block view illustrating a semiconductor memory system in accordance with an embodiment of the present invention.

FIG. 11 is a block view illustrating a semiconductor memory system in accordance with an embodiment of the present invention.

Referring to FIG. 11, the semiconductor memory system may include a controller 1110 and a semiconductor memory device 1120.

The controller 1110 may control a read/write operation of the semiconductor memory device 1120. The semiconductor memory device 1120 may store a data signal DAT in a memory cell corresponding to an address signal ADD during the write operation, and output the data stored in the memory cell corresponding to the address signal ADD during the read operation.

Meanwhile, the controller 1110 may generate refresh type information REF_TY based on an address signal ADD and an active signal ACT for an activation operation of a plurality of word lines. Herein, the refresh type information REF_TY may be set based on the enablement numbers of the active signal ACT and the enablement numbers of the enabled address signals ADD. In other words, how often the active signal ACT is enabled, and how many times the same address signal is generated.

Subsequently, the semiconductor memory device 1120 may set up a target detection condition in response to the refresh type information REF_TY, and perform a refresh operation based on the target detection condition. For example, when the semiconductor memory device 1120 is embodied as described with reference to FIG. 10, in other words, when the semiconductor memory device 1120 includes the activation time detection unit 1030 and the activation number detection unit 1050, the semiconductor memory device 1120 may detect the target word line based on the activation time and the activation numbers of a word line. Herein, "the activation time" and "the activation numbers" of a word line may become the target detection condition. After all, the semiconductor memory device 1120 may detect the target word line based on the target detection condition set by the controller 1110, and perform the refresh operation on the neighboring word lines adjacent to the word line.

Meanwhile, activation of the activation time detection unit 1030 and/or the activation number detection unit 1050 included in the semiconductor memory device 1120 may depend on the refresh type information REF_TY. In other words, the semiconductor memory device 1120 may use the activation time detection unit 1030 and/or the activation number detection unit 1050 according to the circumstances, and the amount of power consumed during a refresh operation may be minimized in this way.

The semiconductor memory system in accordance with the embodiment of the present invention may be secured with a refresh operation more broadly by setting the target detection condition.

According to the embodiments of the present invention described above, the semiconductor memory device may prevent data loss that may be caused by coupling effects by detecting whether a word line is activated and reflecting the detection result into a refresh operation. The refresh operation may increase reliability of data stored in the semiconductor memory device.

According to an embodiment of the present invention, the reliability of the data stored in a semiconductor memory device may be increased by efficiently performing a refresh operation.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
a memory cell array including a plurality of word lines;
a word line driving unit suitable for activating a first word line among the plurality of word lines corresponding to an input address signal;
an activation time detection unit suitable for enabling a detection signal by detecting an activation time of the first word line;
an address latch unit suitable for latching an address information for a second word line corresponding to the first word line in response to the detection signal; and
an address output unit suitable for providing the word line driving unit with the latched address information for the second word line during a refresh operation,
wherein the activation time detection unit includes:
a reference value generator suitable for generating a reference value; and
an activation time comparator suitable for enabling the detection signal by comparing the activation time of the first word line with the reference value, and
wherein the reference value depends on an operation state of the memory cell array.

2. The semiconductor memory device of claim 1, wherein the first and second word lines are adjacent to each other.

3. A semiconductor memory device, comprising:
a memory cell array including a plurality of word lines;
a word line driving unit suitable for activating a first word line among the plurality of word lines corresponding to an input address signal;
an activation time detection unit suitable for enabling a first detection signal by detecting an activation time of the first word line;
a detection number detection unit suitable for enabling a second detection signal by detecting enablement numbers of the first detection signal;
an address latch unit suitable for latching an address information for a second word line corresponding to the first word line in response to the second detection signal; and
an address output unit suitable for providing the word line driving unit with the latched address information for the second word line during a refresh operation;
wherein the detection number detection unit includes:
an enablement number counter suitable for counting the enablement numbers of the first detection signal;
a reference number value generator suitable for generating a reference number value; and
a reference number value comparator suitable for enabling the second detection signal by comparing the enablement numbers of the first detection signal with the reference number value.

* * * * *